United States Patent
Zafrany et al.

(10) Patent No.: US 6,769,619 B2
(45) Date of Patent: Aug. 3, 2004

(54) ELECTRONIC MODULE FOR CHIP CARD

(75) Inventors: Michael Zafrany, Marseilles (FR); Philippe Patrice, Allauch (FR)

(73) Assignee: Gemplus, Gemenos Cedex (FR)

( * ) Notice: Subject to any disclaimer, the term of this patent is extended or adjusted under 35 U.S.C. 154(b) by 114 days.

(21) Appl. No.: 10/141,180

(22) Filed: May 9, 2002

(65) Prior Publication Data

US 2002/0125329 A1 Sep. 12, 2002

Related U.S. Application Data

(63) Continuation of application No. 09/402,008, filed as application No. PCT/FR98/00500 on Mar. 9, 1998, now Pat. No. 6,435,414.

(30) Foreign Application Priority Data

Mar. 27, 1997 (FR) .............................................. 97 04094

(51) Int. Cl.[7] .............................................. G06K 19/00
(52) U.S. Cl. ...................................... 235/487; 235/492
(58) Field of Search ................................ 235/487, 492; 257/661, 673, 677, 734, 737, 773, 679

(56) References Cited

U.S. PATENT DOCUMENTS 4,792,843 A    12/1988   Haghiri-Tehrani et al.
5,255,430 A    10/1993   Tallaksen
5,960,308 A     9/1999   Akagawa et al.
6,107,109 A     8/2000   Akram et al.
6,166,911 A    12/2000   Usami et al.
6,435,414 B1 *  8/2002   Zafrany et al. .............. 235/487

FOREIGN PATENT DOCUMENTS

DE          4325458 A       2/1995
DE          4441052 A       5/1996
JP         08039974 A       6/1996
WO          96/37917       11/1996

* cited by examiner

Primary Examiner—Karl D. Frech
(74) Attorney, Agent, or Firm—Burns, Doane, Swecker & Mathis, L.L.P.

(57) ABSTRACT

The invention concerns an electronic module that is designed to be fixed in an electronic device in the form of a card. The module includes a medium having at least a surface provided with contact pads and a microcircuit which is fixed on the medium and has exit hubs each connected to a medium contact pad. The connections between the exit hubs and the contact pads consist of a cord made of an adhesive conductive substance which conforms to the profile of the medium. Preferably, the conductive substance is a conductive isotropic adhesive.

12 Claims, 1 Drawing Sheet

ELECTRONIC MODULE FOR CHIP CARD

This disclosure is based upon, and claims priority from, French Patent Application No. 97/04094, filed Mar. 27, 1997, continuation of Ser. No. 09/402,008, filed Nov. 22, 1999 U.S. Pat. No. 6,435,414, and International Application No. PCT/FR98/00500, filed Mar. 9, 1998, the contents of which are incorporated herein by reference.

FIELD OF THE INVENTION

The present invention concerns electronic modules intended particularly to be fixed in electronic units in the form of cards, comprising a medium with at least one side provided with contact pads and a microcircuit which is fixed on said medium and which comprises exit hubs, each connected to a contact pad on the medium.

BACKGROUND OF THE INVENTION

Electronic systems in the form of cards comprise, in particular, integrated circuit cards, also called chip cards, along with electronic element media for televisions, VCR's, etc. A chip card comprises a card body and a module comprising the chip integrated within the body of the card. A chip card module comprises a medium, generally made of epoxy glass, with a metal plated surface in order to provide contact pads and a chip which is glued to the other side of the medium and which includes exit hubs on its outer side. Connection holes in the medium allow for passage of connecting wires which connect exit hubs to contact pads.

The connecting wires, made of stainless metal such as gold or aluminium, are soldered using various technologies such as soldering via ultra-sound or thermocompression which requires later coating ("glob top") of the connecting wires with a resin to protect them. It is sometimes necessary to first fix a retaining barrier for the resin, such as a metallic or silicon ring, to the medium.

The mass of the resin is deposited in a non-controllable way and, when it is polymerized, it forms a very thick drop which exceeds the height of the chip card specifications. A milling operation is therefore necessary to reduce the thickness of the module to the required value. This milling operation can damage the module and is the main cause of production rejects.

In the body of a chip card, a cavity is made which is to receive the module and which must be relatively deep in order to receive a thick module. The thickness of the body of the card at the cavity is low, leading to significant deformation when the body of the chip card is bent, thus limiting the reliability and the working life of the card.

In addition, polymerization of this drop of resin provokes swelling of the module. This swelling can lead to deterioration of chip card readers.

The main purpose of the invention is to provide a shorter electronic module in order to eliminate the above mentioned problems.

SUMMARY OF THE INVENTION

An electronic module according to the invention has connections between the exit hubs and the contact pads that are made of a cord of an adhesive conducting substance which conforms to the profile of the medium.

These connections do not require a protective coating, allowing for reduction in the height of the module. Production is thus simplified and in particular the milling operation is eliminated, substantially reducing the rate of production rejects.

Preferably, the conducting substance is an isotropic conducting glue. A metal deposited by screen printing can also be used.

If the medium has connection holes, these are filled with the conducting substance. The medium may have two sides provided with contact pads and the connections are made directly on two sides without using the connection holes. Preferably, one of the sides of the medium is covered with an activatable adhesive film. This is an additional protection for the microcircuit and makes it possible to simplify the fixing of the module into the body of the card.

The microcircuit exit hubs may have connection bumps in order to reduce contact resistance.

Another aspect of the invention is a method for making an electronic module, in which the cord is made by depositing a viscous conducting substance. This technique of depositing using a syringe or similar device is rapid and easy to use.

In another aspect of the invention, a chip card has at least one electronic module of the previously mentioned type.

BRIEF DESCRIPTION OF THE DRAWINGS

Other characteristics and advantages of the invention will appear when reading the detailed description which follows. These will be more clearly understood by consulting the appended drawings in which.

DETAILED DESCRIPTION

Figure 1:
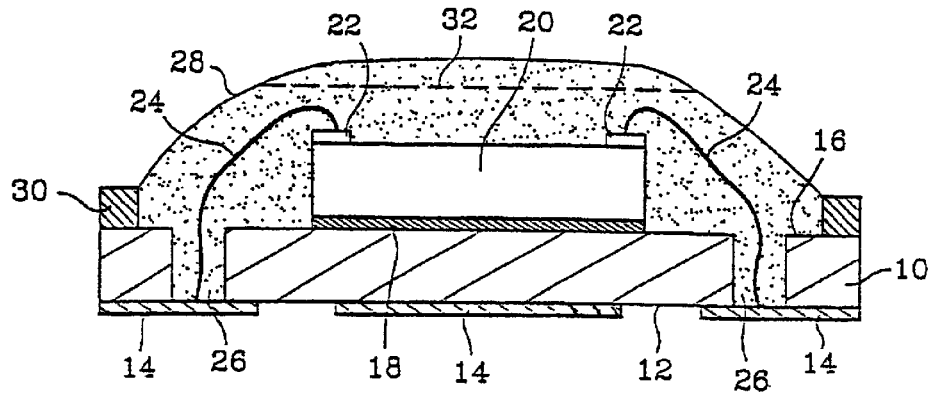
FIG. 1 is a diagram of a cross section of an electronic module of a known type.

FIG. 1 shows an electronic module of a known type. It comprises a medium 10, for example an epoxy glass. One of its sides 12 includes contact pads 14 made by metallization. The other side 16 includes a layer of glue 18 for fixing the lower side of a microcircuit 20 which includes exit hubs 22 on its upper free side.

The connections between the exit hubs 22 and the contact pads 14 are made by soldering metal wires 24 which each go through a connection hole 26 made in the medium 10. After the soldering of the wires 24, these elements are coated with a polymerizable resin which forms a drop 28 which is retained by a peripheral ring 30 made of silicone. This drop 28 is applied in a non-controlled manner and has a substantial thickness which considerably increases the height of the module, so much so that it is necessary to make its upper part even by a machining operation such as milling, as shown through the dotted line 32.

As indicated above, the presence of this drop 28 may reduce the mechanical strength of the chip card at the cavity which receives the module so that the mechanical strength of the card at this place is insufficient and, in addition, the card may swell at this place.

Figure 2:
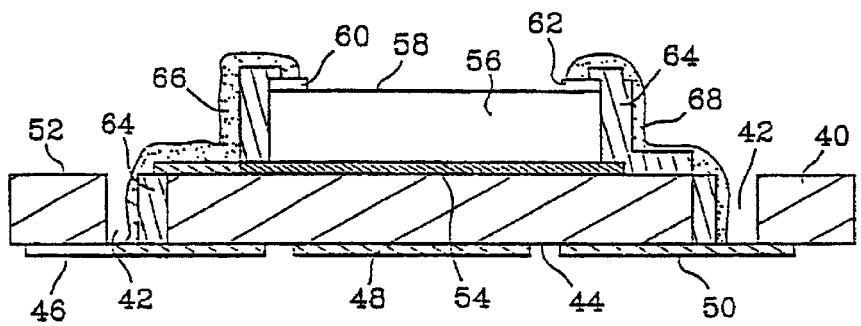
FIG. 2 shows an electronic module according to the present invention.

FIG. 2 shows an electronic module according to the present invention. The medium 40 includes connection holes 42. The lower side 44 of the medium 40 is metallized and includes contact pads 46, 48 and 50. The upper side 52 of the medium 40 has a layer 54 of glue for fixing a chip 56 which has, on its upper side 58, exit hubs 60 and 62 which can be provided with contact bumps which are not shown. A surface layer 64 of insulating adhesive is applied on the periphery of the chip 56, on the side 52 of the medium next to the chip and in the connection holes 42.

In accordance with the invention, connections 66 and 68 between exit hubs 60 and 62 and contact pads 46 and 50 are composed of a cord or strip of an adhesive conducting substance which conforms to the profile of the medium, particularly that part which is in contact with the adhesive surface layer 64 and whose extremities are in contact with the exit hub and the associated contact pad. This substance is applied in a viscous state.

The application of this substance, for example an isotropic conducting glue, is done by a deposit technique called "dispensing", according to which a liquid or low-viscosity substance is applied using a syringe or similar device with controlled outflow and opening.

This dispensing operation is done, for example, using a commercially-available unit called CAM/ALOT made by the American company Camelot Systems Inc. and used for mass production of electronic circuits. The movement and opening of the syringe is controlled by a computer program.

These connections can also be made using metal deposited by screen printing.

In order to improve the electrical contact, the exit hubs can have contact bumps and the contact of the extremities of the cords of the conducting substances is made with these bumps.

Figure 3:
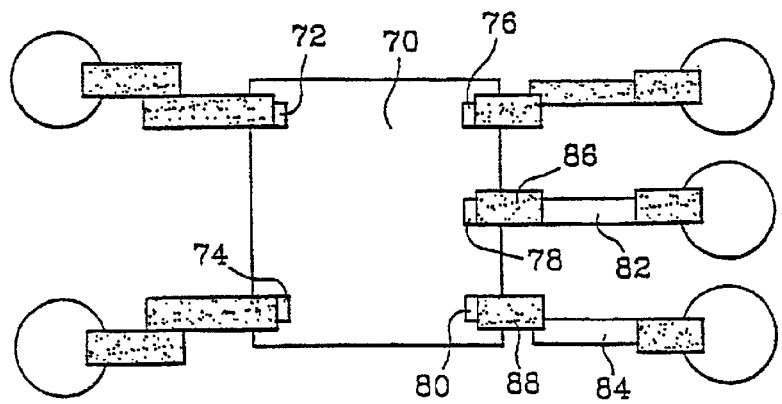
FIG. 3 is a top view of an embodiment of a module whose medium includes two sides provided with contact pads.

The invention also applies to cases in which the medium includes two metallized sides which include contact pads. This is illustrated in FIG. 3 which is a partial top view of the module where a chip 70 can be seen with its exit hubs 72, 74, 76, 78 and 80. Hubs 72, 74 and 76 are connected to a contact pad on the lower side of the medium and the hubs 78 and 80 are connected to a pad 82, respectively 84, arranged on the upper side of the medium, and also by a cord of an adhesive conducting substance 86, respectively 88.

The electronic module according to the invention many be covered with an activatable adhesive film, for example by heating or with ultraviolet rays in order to increase the protection of the chip and to simplify the fixing of the module in the cavity of the card body.

The making of the direct connections according to the present invention applies to the production of all electronic units in the form of cards such as video or kitchen appliance control cards.

As can be seen, the invention makes it possible to eliminate the coating of the connections and thus reduce the thickness of the modules. Also, the resins used as conducting substances are very flexible, thus increasing the reliability of the module.

The operations related to coating of the connections, i.e. the placing of a retaining barrier such as a silicone ring, the depositing of the coating resin and the machining of the resin drop, are eliminated. Production is simplified and production costs are reduced.

The invention makes it possible for the body of the card to be thicker at the module and consequently increases the mechanical strength of the card. The invention also eliminates the swelling phenomenon and the resulting deterioration of card readers.

Thanks to the invention, the dimensions of the modules in the plane of the microcircuit can be reduced, allowing for mass production of modules with two adjacent module lines.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalents thereof are intended to be embraced therein.

What is claimed is:

1. An electronic module for use in an electronic card unit, comprising:
    a medium having at least one side that is provided with contact pads;
    a microcircuit which is fixed to said medium and which includes exit hubs; and
    cords of adhesive conducting substance which conform to the profile of the medium and which form connections between the exit hubs and the contact pads.

2. An electronic module according to claim 1, wherein said cords are formed from a viscous conducting substance.

3. An electronic module according to claim 1, wherein the conducting substance is an isotropic conducting glue.

4. An electronic module according to claim 1, wherein the medium includes two sides provided with contact pads.

5. An electronic module according to claim 1, wherein one of the sides of the module is covered by an activatable adhesive film.

6. An electronic module according to claim 1, wherein the exit hubs of the module have connection bumps.

7. A chip card containing at least one electronic module which comprises:
    a medium having at least one side that is provided with contact pads;
    a microcircuit which is fixed to said medium and which includes exit hubs; and
    cords of adhesive conducting substance which conform to the profile of the medium and which form connections between the exit hubs and the contact pads.

8. An chip card according to claim 7, wherein said cords are formed from a viscous conducting substance.

9. An chip card according to claim 7, wherein the conducting substance is an isotropic conducing glue.

10. An chip card according to claim 7, wherein the medium includes two sides provided with contact pads.

11. An chip card according to claim 7, wherein one of the sides of the module is covered by an activatable adhesive film.

12. An chip card according to claim 7, wherein the exit hubs of the module have connection bumps.

* * * * *